United States Patent
Amani et al.

(10) Patent No.: US 9,852,927 B2
(45) Date of Patent: Dec. 26, 2017

(54) NEAR-UNITY PHOTOLUMINESCENCE QUANTUM YIELD IN MOS$_2$

(71) Applicants: Matin Amani, Berkeley, CA (US); Der-Hsien Lien, Berkeley, CA (US); Daisuke Kiriya, Berkeley, CA (US); James Bullock, Tarcutta (AU); Ali Javey, Lafayette, CA (US)

(72) Inventors: Matin Amani, Berkeley, CA (US); Der-Hsien Lien, Berkeley, CA (US); Daisuke Kiriya, Berkeley, CA (US); James Bullock, Tarcutta (AU); Ali Javey, Lafayette, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 15/294,707

(22) Filed: Oct. 15, 2016

(65) Prior Publication Data

US 2017/0110338 A1    Apr. 20, 2017

Related U.S. Application Data

(60) Provisional application No. 62/242,427, filed on Oct. 16, 2015.

(51) Int. Cl.
| | | |
|---|---|---|
| *H01L 21/02* | (2006.01) | |
| *H01L 21/465* | (2006.01) | |
| *H01L 31/00* | (2006.01) | |
| *H01L 29/22* | (2006.01) | |
| *C09K 11/00* | (2006.01) | |
| *H01S 3/16* | (2006.01) | |

(52) U.S. Cl.
CPC ............ *H01L 21/465* (2013.01); *C09K 11/00* (2013.01); *H01L 21/02568* (2013.01); *H01L 29/22* (2013.01); *H01L 31/00* (2013.01); *H01S 3/162* (2013.01)

(58) Field of Classification Search
None
See application file for complete search history.

(56) References Cited

U.S. PATENT DOCUMENTS

2015/0004733 A1 *    1/2015    Wang .................... C01B 19/007
                                                                438/54

* cited by examiner

*Primary Examiner* — Jay C Chang

(57) ABSTRACT

Two-dimensional (2D) transition-metal dichalcogenides have emerged as a promising material system for optoelectronic applications, but their primary figure-of-merit, the room-temperature photoluminescence quantum yield (QY) is extremely poor. The prototypical 2D material, MoS$_2$ is reported to have a maximum QY of 0.6% which indicates a considerable defect density. We report on an air-stable solution-based chemical treatment by an organic superacid which uniformly enhances the photoluminescence and minority carrier lifetime of MoS$_2$ monolayers by over two orders of magnitude. The treatment eliminates defect-mediated non-radiative recombination, thus resulting in a final QY of over 95% with a longest observed lifetime of 10.8±0.6 nanoseconds. Obtaining perfect optoelectronic monolayers opens the door for highly efficient light emitting diodes, lasers, and solar cells based on 2D materials.

3 Claims, 17 Drawing Sheets

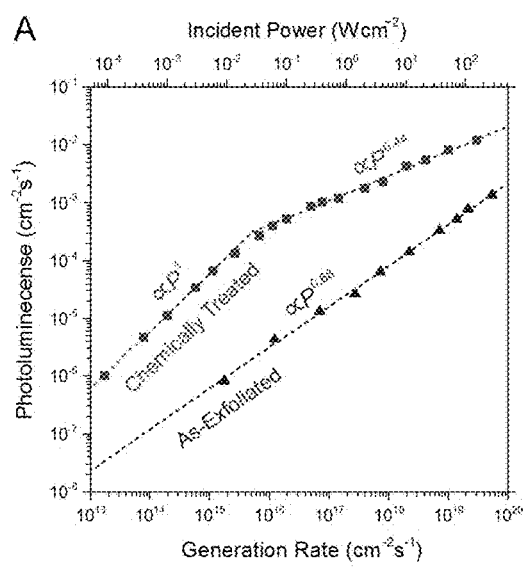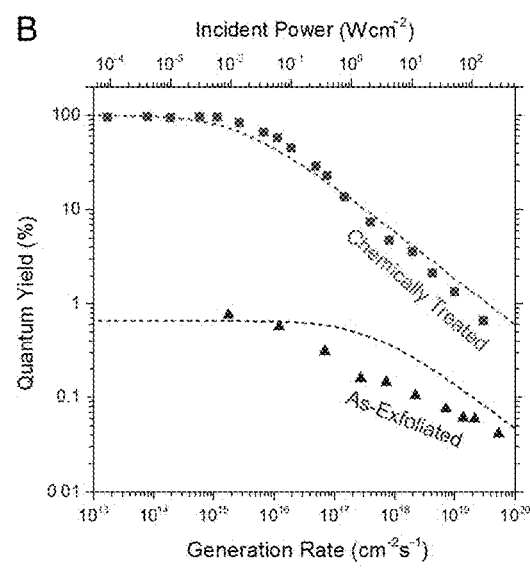
Fig. 2A  Fig. 2B

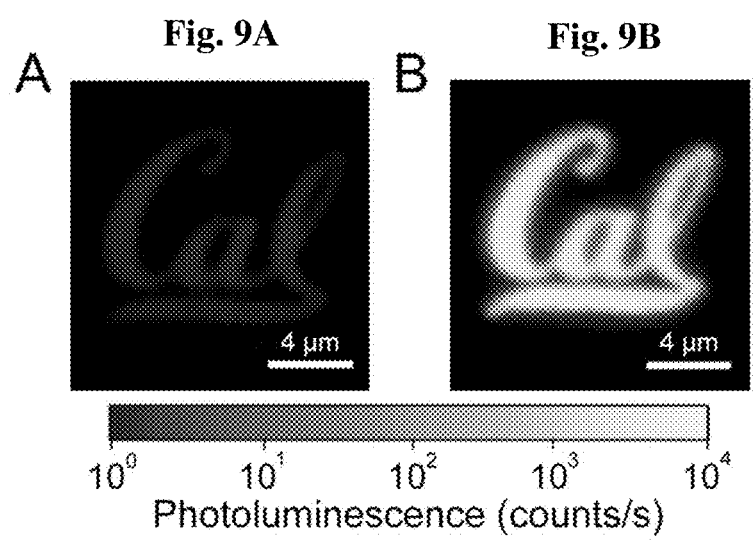

NEAR-UNITY PHOTOLUMINESCENCE QUANTUM YIELD IN $MoS_2$

CROSS REFERENCE TO RELATED APPLICATIONS

This US Application claims priority to U.S. Provisional Application Ser. No. 62/242,427 filed Oct. 16, 2015, which application is incorporated herein by reference as if fully set forth in their entirety.

STATEMENT OF GOVERNMENTAL SUPPORT

The invention described and claimed herein was made in part utilizing funds supplied by the U.S. Department of Energy under Contract No. DE-AC02-05CH11231 between the U.S. Department of Energy and the Regents of the University of California for the management and operation of the Lawrence Berkeley National Laboratory. The government has certain rights in this invention.

BACKGROUND OF THE INVENTION

Field of the Invention

The present invention relates to the field of semiconductor emitters and detectors.

Related Art

Surface defects dominate the behavior of minority carriers in semiconductors and place a strong limit on the performance. This is especially true in optoelectronic devices whose behavior is completely dominated by minority carriers. One of the major implications is that the photoluminescence quantum yield (a figure that dictates the efficiency of devices such as light emitting diodes, lasers, and solar cells) is extremely low in materials that contain a large number of surface defects.

This problem is currently addressed in Silicon by using hydrofluoric (HF) treatment for surface passivation. However, HF treatment is unstable and the reduction in surface recombination velocity after treatment only lasts for 1-2 minutes.

Here we utilize chemical treatments using an organic super acid molecule to passivate and/or repair the surface defects in various semiconductor systems.

Enhancing the photoluminescence quantum yield (QY) in 2D transition metal dichalcogenide (TMDCs) to values near 100% such as $MoS_2$, $WS_2$, $MoSe_2$, $WSe_2$, $MoTe_2$, $WTe_2$ enables the fabrication of high performance optoelectronic devices (including but not limited to light emitting diodes, lasers, and solar cells).

Bistriflimide, systematically known as bis(trifluoromethane)sulfonimide and colloquially as TFSI, is a non-coordinating anion with the chemical formula $[(CF_3SO_2)_2N]^-$. In use with silicon, TFSI treatment can be used as a surface passivation treatment for devices which can dramatically reduce the surface recombination velocity (SRV). For example in use in solar cells this can have a dramatic improvement on the Voc of the device. The air-stable room-temperature reduction of the SRV by TFSI also permits the bulk lifetime to be easily measured.

By chemical treatment, the luminescence efficiency of monolayer $MoS_2$ is enhanced from 1% to >95% enabling high performance chalcogenide optoelectronics.

BRIEF DESCRIPTION OF THE DRAWINGS

The foregoing aspects and others will be readily appreciated by the skilled artisan from the following description of illustrative embodiments when read in conjunction with the accompanying drawings.

FIG. 1A illustrates PL spectrum measured for both as-exfoliated and TFSI treated $MoS_2$ monolayers measured at an incident power of $1\times10^{-2}$ $Wcm^{-2}$ (insert shows normalized spectra).

FIGS. 1B and 1C illustrate PL image of a $MoS_2$ monolayer (insert shows optical micrograph) before treatment FIG. 1B and after treatment FIG. 1C.

FIGS. 2A and 2B illustrate steady-state luminescence. FIG. 2A illustrates pump-power dependence of the integrated photoluminescence for as-exfoliated and treated $MoS_2$; dashed lines show power law fits for the three dominant recombination regimes. FIG. 2B illustrates pump-power dependence of the QY for as-exfoliated and treated $MoS_2$; dashed lines show the recombination model.

FIG. 3A illustrates radiative decay of an as-exfoliated $MoS_2$ sample at various initial carrier concentrations ($n_0$) as well as the instrument response function (IRF). FIG. 3B illustrates radiative decay of a treated $MoS_2$ sample plotted for several initial carrier concentrations ($n_0$) as well as the IRF. FIG. 3C illustrates effective PL lifetime as a function of pump-fluence; the dashed line shows a power law fit for the dominant recombination regimes.

FIG. 4A illustrates AFM images taken before and after TFSI treatment. FIG. 4B illustrates transfer characteristics of a monolayer $MoS_2$ transistor both before and after treatment. FIG. 4C illustrates Raman spectrum of as-exfoliated and TFSI treated $MoS_2$ samples. FIG. 4D illustrates absorption spectrum of the as-exfoliated (x) and treated (y) $MoS_2$ samples. FIG. 4E illustrates XPS spectrum of the S 2p and Mo 3d core levels before and after treatment. Inserts show that there is no appearance of $SO_x$ or change in the $MoO_x$ peak intensity after treatment.

FIG. 5A illustrates an optical setup used to measure PL spectrum as well as calibration via a R6G film. FIG. 5B illustrates an optical setup used for calibrating the absolute collection efficiency via a near ideal diffuse reflector.

FIG. 7A illustrates an optical setup used to measure the absorption at 514.5 nm. FIG. 7B illustrates a system configuration used to measure the full absorption spectrum via separately measuring the transmitted and reflected light from a white laser source.

FIG. 8A illustrates a linear scale PL image for the as-exfoliated monolayer shown in FIG. 1B; scale bar is 10 μm. FIG. 8B illustrates a linear scale PL image for the treated monolayer shown in FIG. 1C; scale bar is 10 μm.

FIGS. 9A and 9B illustrate photoluminescence image of patterned monolayer. FIG. 9A illustrates a PL image for a monolayer patterned by e-beam lithography into the shape of the Berkeley "Cal" logo. FIG. 9B illustrates a PL image for the same patterned monolayer after treatment by TFSI.

FIG. 15A illustrates pump-power dependence of the integrated luminescence of $MoS_2$ treated by Ph-TFSI in DCB/DCE (9/1 v/v %). FIG. 15B illustrates pump-power dependence of the QY for $MoS_2$ treated by Ph-TFSI in DCB/DCE (9/1 v/v %).

FIG. 16A illustrates calculated DoS for sulfur vacancies ($V_s$), adsorbed —OH at the $V_s$ site, and adsorbed water. FIG. 16B illustrates calculated DoS for a sulfur vacancy site passivated by one, two, or three hydrogen atoms. FIG. 16C illustrates energy of formation for the chemical configurations shown in FIGS. 16A, 16B.

FIG. 17A illustrates S 2p core levels for the same $MoS_2$ flake before and after treatment measured at four different spots; spectra for the center is shown in FIG. 4E. FIG. 17B illustrates Mo 3d core levels for the same $MoS_2$ flake before and after treatment measured at four different spots; spectra for the center is shown in FIG. 4E.

DETAILED DESCRIPTION

In the discussions that follow, various process steps may or may not be described using certain types of manufacturing equipment, along with certain process parameters. It is to be appreciated that other types of equipment can be used, with different process parameters employed, and that some of the steps may be performed in other manufacturing equipment without departing from the scope of this invention. Furthermore, different process parameters or manufacturing equipment could be substituted for those described herein without departing from the scope of the invention.

These and other details and advantages of the present invention will become more fully apparent from the following description taken in conjunction with the accompanying drawings.

Monolayer transition metal dichalcogenide (TMDCs) have properties that make them highly suitable for optoelectronics, including the ability to form "van der Waals heterostructures" without the need for lattice matching, circular dichroism arising from the direct band gap occurring at the K and K' points of the Brillouin zone, and widely tunable band-structure through the application of external forces such as electric field and strain. Unlike III-V semiconductors, the optical properties of TMDCs are dominated by excitons with strong binding energies (on the order of 300 meV) and large radii (~1.6 nm). However, TMDCs have exhibited poor luminescence quantum yield (QY); i.e. the number of photons the material radiates is much lower than the number of generated electron-hole pairs. QY values ranging from 0.01% to 6% have been reported, which indicate a high density of defect states and mediocre electronic quality. The origin of the low quantum yield observed in these materials is attributed to defect-mediated nonradiative recombination and biexcitonic recombination at higher excitation powers.

Two-dimensional (2D) monolayers are amenable to surface passivation by chemical treatments. We studied a wide range of chemical treatments and demonstrate an air-stable, solution-based, process using an organic superacid that removes the contribution of defect-mediated non-radiative recombination that acts on electronically active defect sites by uniformly passivating them, repairing them, or both. The photoluminescence (PL) in $MoS_2$ monolayers increased by over two orders of magnitude, resulting in a QY>95% and a characteristic lifetime of 10.8±0.6 nanoseconds at low excitation densities.

Figures 1A, 1B, 1C:
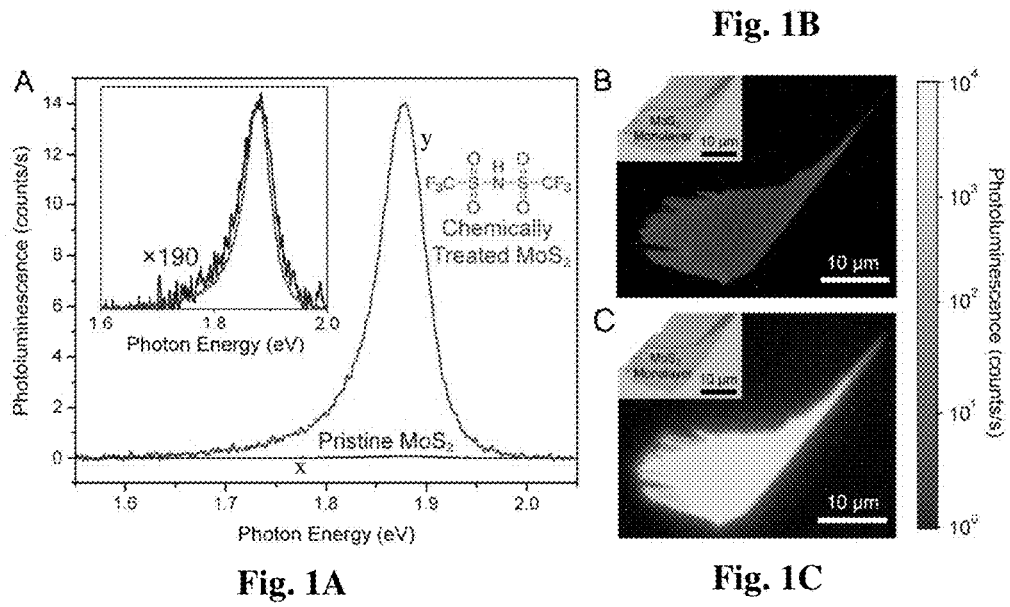
FIGS. 1A, 1B and 1C illustrate enhancement of photoluminescence by chemical treatment.

In this study, $MoS_2$ monolayers were treated by a non-oxidizing organic superacid: bis(trifluoromethane)sulfonimide (TFSI). Superacids have a Hammett acidity function ($H_0$) that is lower than pure sulfuric acid, and are strong protonating agents. Details of the sample preparation and treatment procedure are discussed in the materials and methods. The PL spectra of a $MoS_2$ monolayer measured before and after TFSI treatment (FIG. 1A) show a 190× increase in the PL peak intensity, with no change in the overall spectral shape. The magnitude of the enhancement depended strongly on the quality of the original as-exfoliated monolayer. PL imaging of a monolayer (FIG. 1B, 1C, FIGS. 8A, 8B) taken before and after treatment at the same illumination conditions shows that the enhancement from the superacid treatment is spatially uniform.

Figure 6:
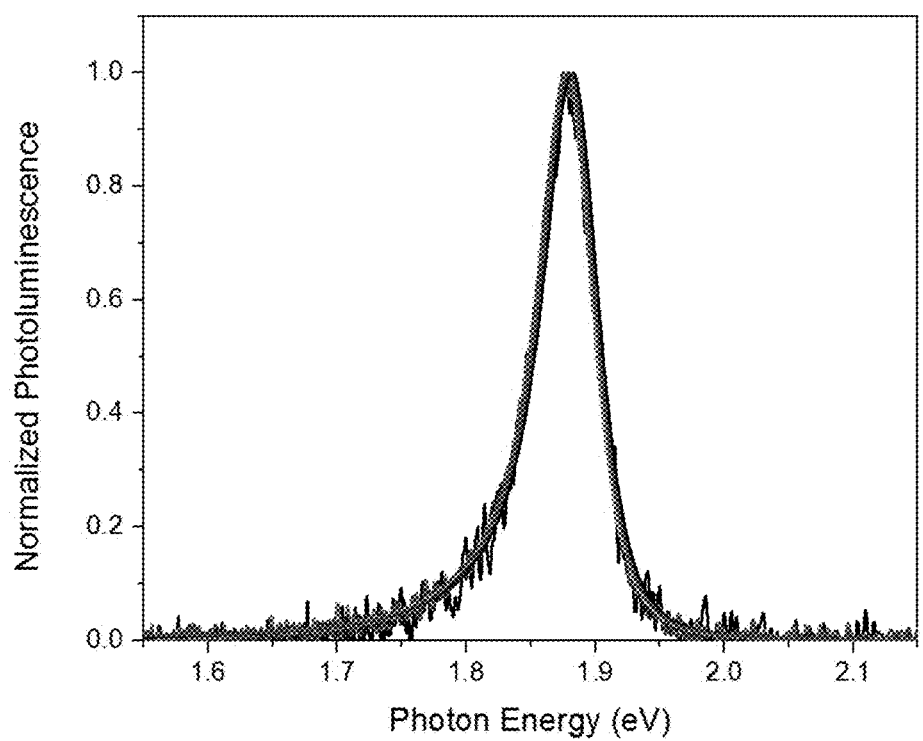
FIG. 6 illustrates a normalized PL spectrum at various pump-power. Normalized PL data used to calculate QY for TFSI treated samples shown in FIGS. 2A and 2B (26 curves are overlaid). No apparent changes in the PL spectral shape are observed as the incident power is varied over the full range of incident powers (from $10^{-4}$ W/cm$^2$ to $10^2$ W/cm$^2$).

Calibrated steady-state PL measurements showed that the spectral shape of the emission remained unchanged over a pump intensity dynamic range of six orders of magnitude ($10^{-4}$ to $10^2$ W cm$^{-2}$; see FIG. 6). From the pump-power dependence of the calibrated luminescence intensity (FIG. 2A) we extracted the QY (FIG. 2B). As-exfoliated samples exhibited low QY with a peak efficiency of 1% measured at $10^{-2}$ Wcm$^{-2}$. The absolute efficiency and observed power law are consistent with previous reports for exfoliated $MoS_2$. After TFSI treatment, the QY reached a plateau at low pump intensity ($<10^{-2}$ Wcm$^{-2}$) with a maximum value greater than 95%. The near-unity QY suggests that within this range of incident power there was negligible non-radiative recombination occurring in the sample. Although pure radiative recombination is commonly observed for fluorescent molecules that inherently have no dangling bonds, only a few semiconductors, such as GaAs double heterostructures and surface passivated quantum dots, show this behavior at room temperature.

At high pump-power, a sharp drop-off in the QY was observed, possibly caused by non-radiative biexcitonic recombination. We consider several models to understand the carrier density-dependent recombination mechanisms in $MoS_2$ before and after TFSI treatment. Here, n and p are the 2D electron and hole concentrations respectively. At high level injection, the dopant concentration is much less than the number of optically generated carriers, allowing n=p. The traditional interpretation without excitons, invokes a total recombination, R, as: $R=An+Bn^2+Cn^3$, where A is the Shockley-Reed-Hall (SRH) recombination rate, B is the radiative recombination rate, and C is the Auger recombination rate. The QY is given as the radiative recombination over total recombination. Auger processes dominate at high carrier concentrations, while SRH recombination dominates at low carrier concentrations. In the SRH regime (i.e., low pump-power), QY increases with pump intensity. This behavior, however, was not observed in previous $MoS_2$ studies nor in this work.

The standard model poorly describes our QY data (see FIG. 14), which is strongly influenced by bound excitons (9). As a result, the radiative rate is proportional to the totalexciton population, $\langle N \rangle$. At high exciton densities, non-radiative biexcitonic recombination can dominate, leading to a recombination rate proportional to $\langle N \rangle^2$. Previous reports also suggest that the luminescence in as-exfoliated samples is limited by non-radiative defect-mediated processes, which results in low QY. Although the precise nature of the defect-mediated non-radiative recombination is unclear, a simple analytical model can be developed to describe our experimental results. The total excitation rate, R, in $MoS_2$ is balanced by recombination $$R = B_{nr} n^2 + B_r n^2 \quad (1)$$

where $B_{nr}$ is the non-radiative defect-mediated recombination rate and $B_r$ is the formation rate of excitons. The generated excitons can then either undergo radiative recombination or non-radiatively recombine with a second exciton according to: $B_r n^2 = \tau_r^{-1} \langle N \rangle + C_{bx} \langle N \rangle^2$ (19), where $\tau_r$ is the radiative lifetime and $C_{bx}$ is the biexcitonic recombination rate. The QY is then given as:

$$QY = \frac{\tau_r^{-1} \langle N \rangle}{\tau_r^{-1} \langle N \rangle + B_{nr} n^2 + C_{bx} \langle N \rangle^2} \quad (2)$$

For the case of the TFSI treated sample, $B_{nr}$ is negligible because the QY at low pump-powers is >95%, allowing us to extract a biexcitonic recombination coefficient $C_{bx}$=2.8 $cm^2 s^{-1}$. For the as-exfoliated sample, the defect-mediated non-radiative recombination can be fit to $B_{nr}$=1.5×10$^6$ $cm^2 s^{-1}$, using the same $C_{bx}$ value. The fitting results are plotted as the dashed curves in FIG. 2B.

Figures 3A, 3B, 3C:
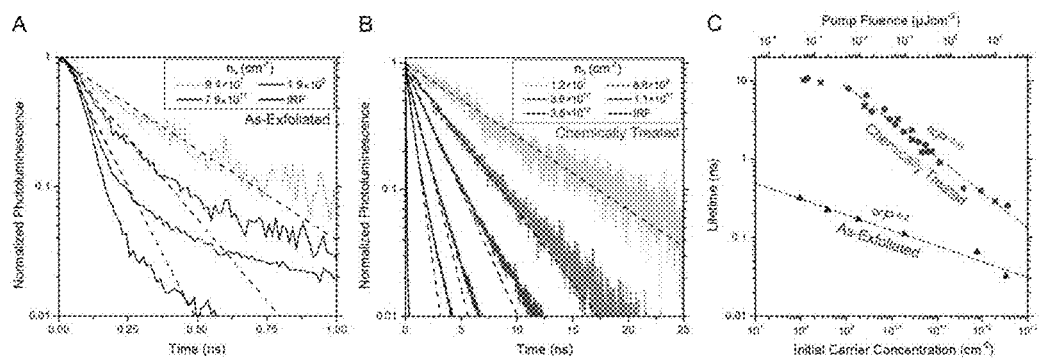
FIGS. 3A, 3B and 3C illustrate time-resolved luminescence.
Figure 10:
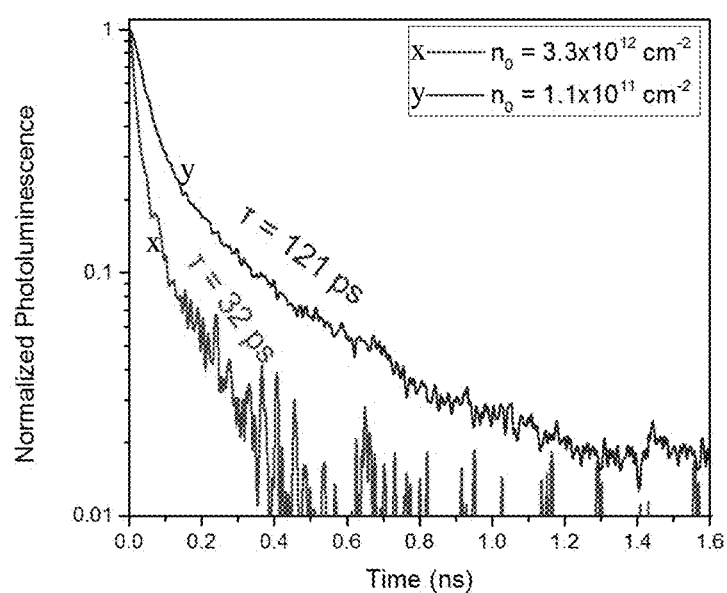
FIG. 10 illustrates as-exfoliated $MoS_2$ time-resolved luminescence. Photoluminescence decay spectrum for as-exfoliated $MoS_2$ measured at multiple excitation powers using a streak camera (2 ps time resolution).
Figure 11:
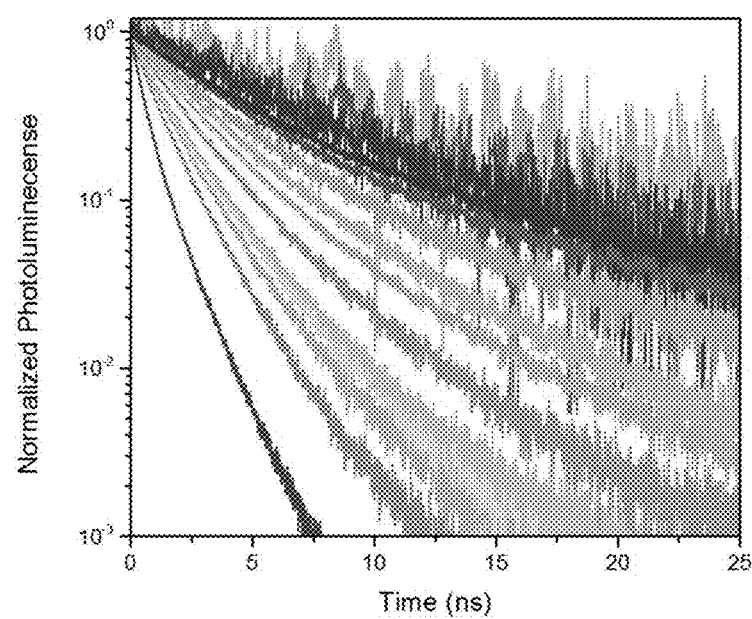
FIG. 11 illustrates treated $MoS_2$ time-resolved luminescence. Photoluminescence decay spectrum measured over a pump-fluence dynamic range of $5\times10^{-4}$ µJcm$^{-2}$ to 20 µJcm$^{-2}$.

Time-resolved measurements were performed on both as-exfoliated and chemically treated samples to investigate the carrier recombination dynamics. The luminescence decay was non-exponential, but not in the standard form known for bimolecular ($Bn^2$) recombination (Eq. 1). As-exfoliated monolayers of $MoS_2$ had extremely short lifetimes on the order of 100 ps (FIG. 3A and FIG. 10), which is consistent with previous reports. After treatment, we saw a substantial increase in the lifetime, which is shown at several pump-fluences in FIG. 3A. Fitting was performed with a single exponential decay that only described the initial characteristic lifetime for a given pump intensity. After the pump-pulse, the exciton population decayed, which resulted in non-exponential decay through reduced non-radiative biexcitonic recombination. At the lowest measurable pump-fluences, we observed a luminescence lifetime of 10.8±0.6 nanoseconds in the treated sample, compared to ~0.3 ns in the untreated case at a pump-fluence of 5×10$^{-4}$ $\mu Jcm^{-2}$ (FIG. 3C). The contrast between FIGS. 3, A and B, is consistent with the QY trend.

Figure 12:
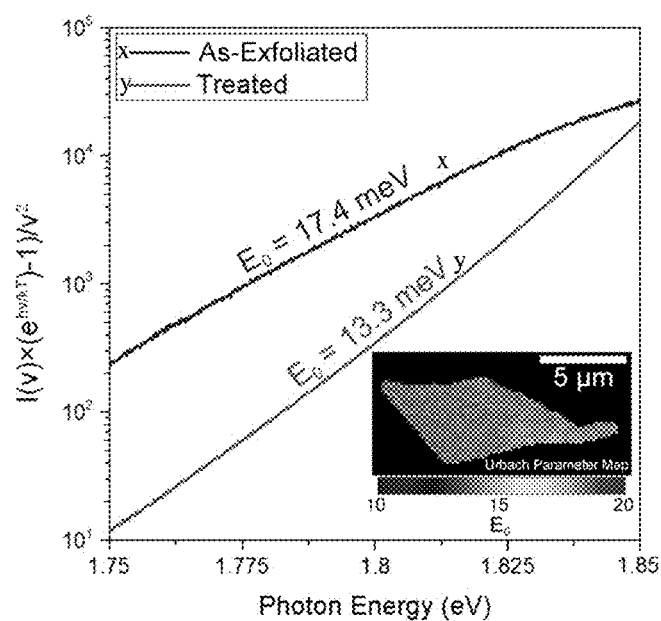
FIG. 12 illustrates band-edge sharpness. Band edge tails extracted from the PL spectrum using the van Roosbroeck-Shockley equation, showing the improvement of the Urbach parameter; the insert shows a spatial map of the Urbach parameter for a TFSI treated sample.
Figure 13:
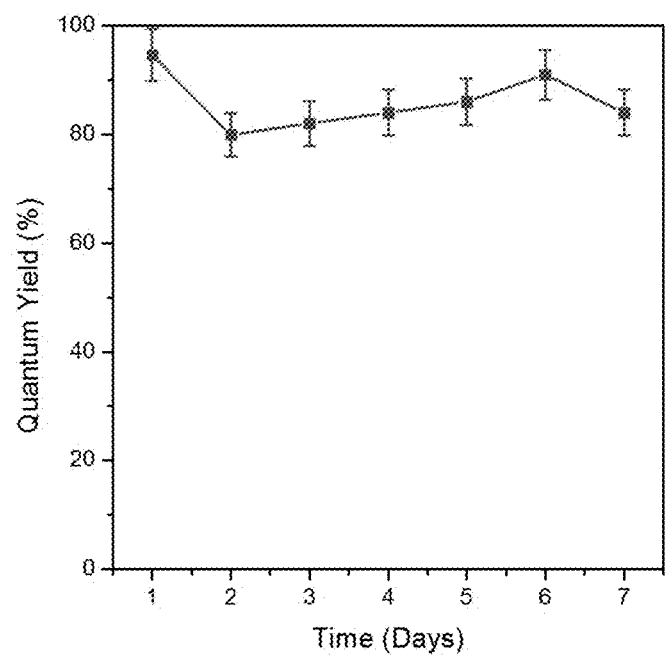
FIG. 13 illustrates treatment stability. QY measured at an incident power of $5\times10^{-3}$ W/cm$^2$ over one week; the sample was stored in ambient conditions (20° to 22° C., 40 to 60% relative humidity).

Urbach tails, which depict the sharpness of the band edges, were derived from the steady-state PL spectra via the van Roosbroeck-Shockley equation, and are plotted in FIG. 12. After the treatment, a noticeable decrease in the Urbach energy, $E_0$, from 17.4 to 13.3 meV was observed, indicating a reduction in the overall disorder from potential fluctuations and improved band edge sharpness. A spatial map showing Urbach energy (FIG. 12) further indicates that the treatment was highly uniform. The QY in air for chemically treated $MoS_2$ was measured daily over the course of 1 week at a constant pump-power to evaluate stability, during which the sample was stored without any passivation in ambient lab conditions (20° to 22° C., 40 to 60% relative humidity) as shown in FIG. 13. The QY remained above 80% during this period of time indicating that the treatment created samples that were relatively stable.

Figures 4A, 4B, 4C, 4D, 4E:
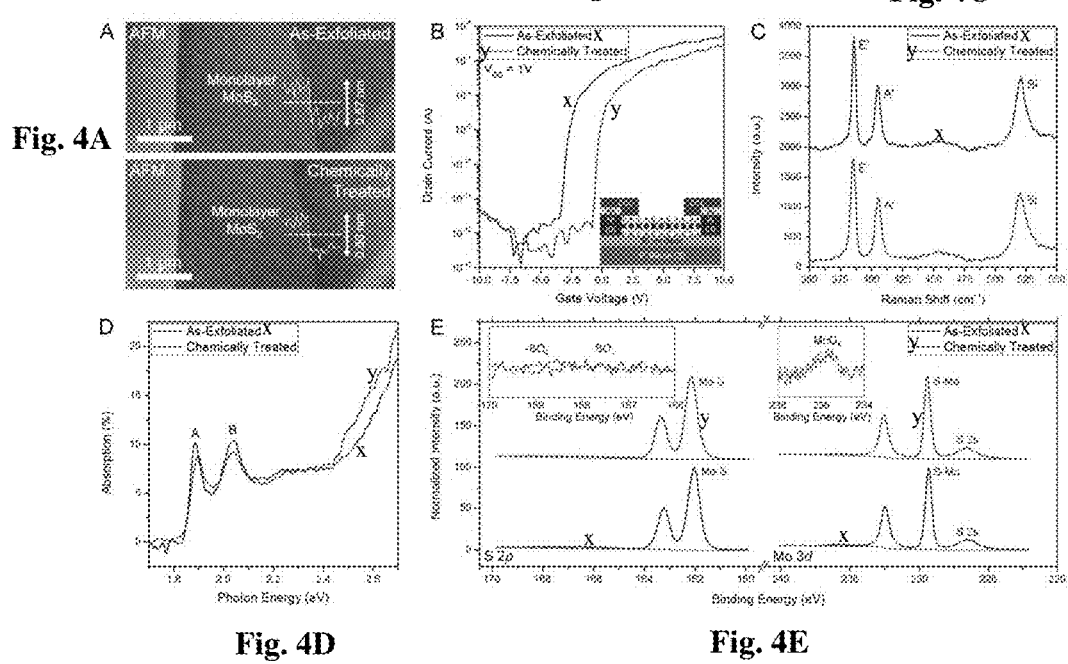
FIGS. 4A-4E illustrate material and device characterization.

We now turn our attention to the effect of TFSI treatment on other properties of $MoS_2$. The monolayer surface was imaged by atomic force microscopy (AFM) before (x) and after treatment (y) (FIG. 4A) from which no visible change to the surface morphology is observed. The effect of the treatment on the electrical properties of a back-gated $MoS_2$ transistor was also investigated. The transfer characteristics of this majority carrier device before and after treatment showed a shift in the threshold voltage toward zero, indicating that the native n-type doping in the $MoS_2$ was removed, while maintaining the same drive current (FIG. 4B). An improvement in the subthreshold slope suggested that the treatment reducing interface trap states. The Raman spectra of an as-exfoliated and treated monolayer (FIG. 4C) showed that there was no change in the relative intensity or peak position. Thus, the structure of $MoS_2$ was not altered during treatment and the lattice was not being subject to any induced strain. Because absolute absorption was used in the calibration of QY, careful absorption measurements were performed using two different methods both before and after treatment (FIG. 4D). At the pump wavelength, (514.5 nm), no measurable change of the absolute absorption from the treatment was observed. The strong resonances at 1.88 and 2.04 eV corresponding to the A and B excitons, respectively, are consistent with previous reports. Surface-sensitive x-ray photoelectron spectroscopy (XPS) was performed on bulk $MoS_2$ from the same crystal used for micromechanical exfoliation. The Mo 3d and S 2p core levels both before and after treatment (FIG. 4E) showed no observable increase in the $MoO_x$ peak or sulfur oxidation after the treatment. Moreover, the oxidation state and bonding of Mo and S showed no appreciable change. Thus, a panoply of different materials characterization techniques show that the structure of the $MoS_2$ remains intact after TFSI treatment, with only the minority carrier properties (i.e. QY and lifetime) being enhanced.

Figure 15A:
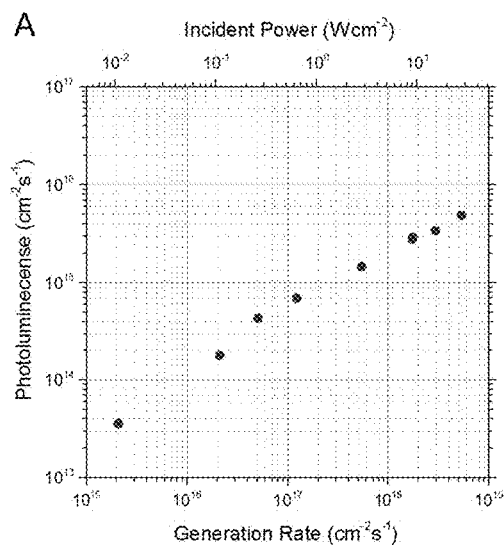
FIGS. 15A and 15B illustrate Luminescence yield after treatment in Ph-TFSI.
Figure 15B:
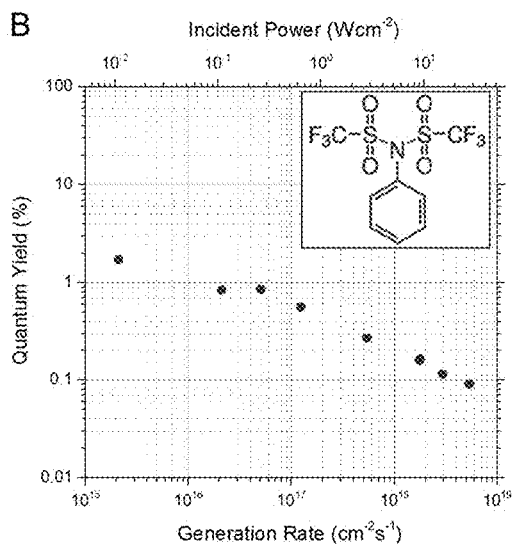

The effect of treatment by a wide variety of molecules is shown in Table 1 and discussed in the supplementary text. Various polar, non-polar and fluorinated molecules, including strong acids and the solvents used for TFSI treatment (dichlorobenzene and dichloroethane) were explored. Treatment with the phenylated derivative of superacid TSFI was also performed (see FIGS. 15A and 15B). These treatments all led to no or minimal (less than one order of magnitude) enhancement in PL QY.

TABLE 1

| Treatment | Chemical formula | QY at 2 × 10$^{-2}$ W/cm$^2$ |
|---|---|---|
| Pristine MoS$_2$ | MoS$_2$ | 0.6% |
| Water | H$_2$O | 2.0% |
| Hexane | C$_6$H$_{14}$ | 0.7% |
| Decane | C$_{10}$H$_{22}$ | 0.4% |

TABLE 1-continued

| Treatment | Chemical formula | QY at 2 × $10^{-2}$ W/cm$^2$ |
|---|---|---|
| Acetone | $C_3H_6O$ | 0.8% |
| Isopropyl Alcohol | $C_3H_8O$ | 1.0% |
| Butanone | $C_4H_8O$ | 0.5% |
| Acetonitrile | $CH_3CN$ | 1.6% |
| Toluene | $C_7H_8$ | 0.6% |
| hexafluorobenzene | $C_6F_6$ | 1.2% |
| Chlorobenzene | $C_6H_5Cl$ | 1.7% |
| 1 2-dichlorobenzene | $C_6H_4Cl_2$ | 8.7% |
| Dichloromethane | $CH_2Cl_2$ | 1.5% |
| 1,2-Dichloroethane | $C_2H_4Cl_2$ | 7.0% |
| Hydrochloric acid | HCl | 1.9% |

Figure 16A:
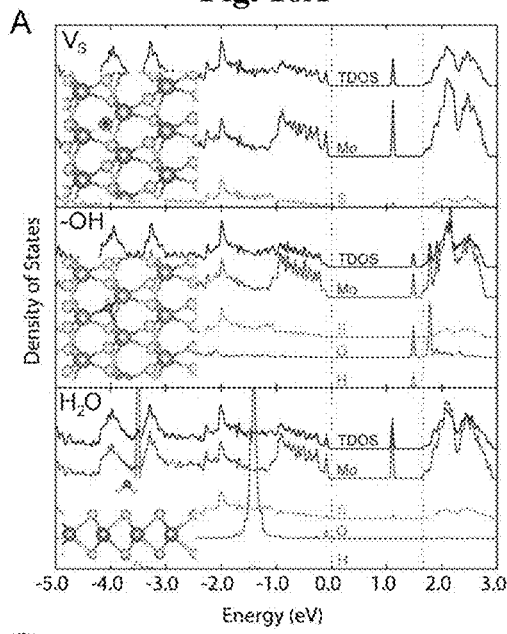
FIGS. 16A, 16B and 16C illustrate DoS and formation energy calculations for possible defect/passivation configurations.
Figure 16C:
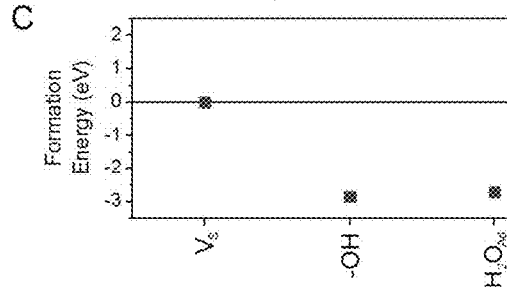
Figure 17A:
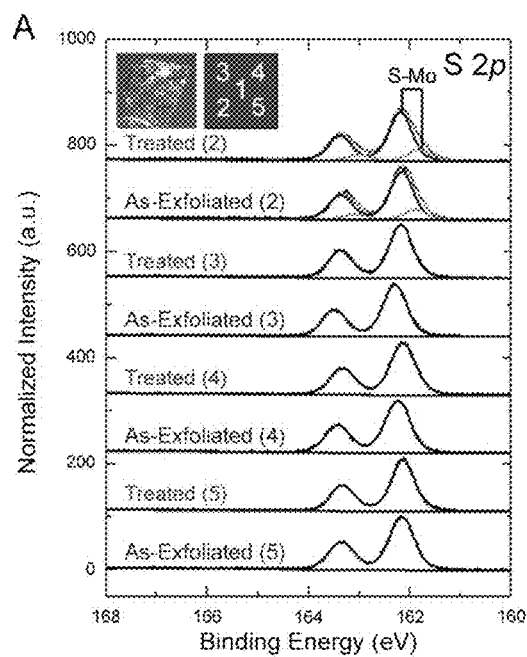
FIGS. 17A and 17B illustrate XPS spatial analysis.
Figure 17B:
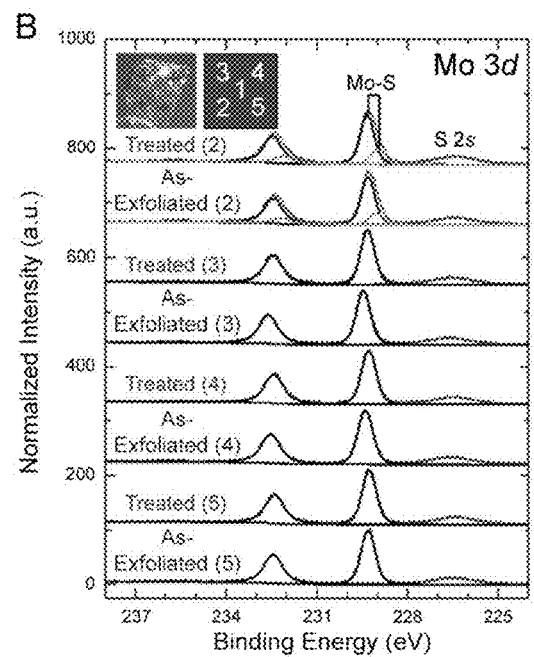

The exact mechanism by which the TFSI passivates surface defects is not fully understood. Exfoliated MoS$_2$ surfaces contain regions with a large number of defect sites in the form of sulfur vacancies, adatoms on the surface, and numerous impurities. In FIG. 16A the calculated mid-gap energy for several defect types are shown, including a sulfur vacancy ($V_s$), adsorbed —OH, and adsorbed water. For all of these cases deep level traps, which contribute to defect-mediated non-radiative recombination resulting in a low QY, are observed. The strong protonating nature of the superacid can remove absorbed water, hydroxyl groups, oxygen and other contaminants on the surface. Although these reactions will not remove the contribution of defects to non-radiative recombination, it will open the active defect sites to passivation by a second mechanism. One possibility is the protonation of the three dangling bonds at each sulfur vacancy site. However, density functional theory (DFT) calculations (see FIG. 16C) show that this reaction is energetically unfavorable. A second possibility is that the surface is restructured to reduce the sulfur vacancies through rearrangement of sulfur adatoms on the surface, which can be facilitated by hydrogenation via TFSI. The presence of sulfur adatom clusters has previously been confirmed by scanning tunneling microscopy and energy-dispersive x-ray spectroscopy. Interestingly, careful examination of the XPS data over multiple spots before and after TFSI treatment (see FIG. 17A an 17B) shows the ratio of bonded sulfur to molybdenum (S/Mo) increased from 1.84±0.04 in the as-exfoliated case to 1.95±0.05 after treatment (Table 2).

TABLE 2

| | Spot 1 | Spot 2 | Spot 3 | Spot 4 | Spot 5 |
|---|---|---|---|---|---|
| As-Exfoliated | 1.791 ± 0.040 | 1.794 ± 0.057 | 1.910 ± 0.043 | 1.885 ± 0.027 | 1.845 ± 0.041 |
| Treated | 2.016 ± 0.045 | 1.900 ± 0.043 | 1.924 ± 0.069 | 1.960 ± 0.044 | 1.946 ± 0.044 |

We have demonstrated an air-stable process by which the PL of monolayer MoS$_2$ can be increased by over two orders of magnitude, resulting in near-unity luminescence yield. This result sheds light on the importance of defects in limiting the performance of 2D systems, and presents a practical route to eliminate their effect on optoelectronic properties. The existence of monolayers with near ideal optoelectronic properties should enable the development of new high-performance light emitting diodes, lasers, and solar cells. These devices can fulfill the revolutionary potential of the 2D semiconductors (1), which require interfacial passivation, as in all classic semiconductors.

Materials and Methods

1. Sample Preparation and Solution Treatment Procedure

MoS$_2$ (SPI Supplies) was mechanically exfoliated on either quartz for quantum yield (QY), lifetime, and absorption measurements or on SiO$_2$/Si substrates for imaging, electrical, and Raman characterization. Monolayers were identified by optical contrast and atomic force microscopy (AFM). The treatment procedure with bis(trifluoromethane) sulfonimide (TFSI) is as follows: 20 mg of TFSI, (Sigma-Aldrich) was dissolved in 10 ml of 1,2-dichloroethane (DCE) (Sigma-Aldrich) to make a 2 mg/ml solution. The solution is further diluted with 1,2-dichlorobenzene (DCB) (Sigma-Aldrich) or DCE to make a 0.2 mg/ml TFSI solution. The exfoliated sample was then immersed in the 0.2 mg/ml solution in a tightly closed vial for 10 min on a hotplate (100° C.). The sample was removed and blow dried with nitrogen without rinsing and subsequently annealed at 100° C. for 5 min. Depending on the initial optical quality of the sample, the treatment sometimes needed to be repeated to obtain >95% QY. As a control experiment we studied N-phenyl-bis(trifluoromethane)sulfonimide (Ph-TFSI) which was prepared using the following procedure: 25 mg of Ph-TFSI (Sigma-Aldrich) was dissolved in 10 ml of DCE (Sigma-Aldrich) to make a 2.5 mg/ml solution. The solution is further diluted with DCB (Sigma-Aldrich) to a 0.25 mg/ml solution. The exfoliated sample was immersed in the 0.25 mg/ml solution in a tightly capped vial for 10 min on a hotplate (100° C.). The sample was removed and blow dried with nitrogen without rinsing and subsequently annealed at 100° C. for 5 min. Prior to treatment, samples were annealed in forming gas (5% H$_2$, 95% N$_2$) at 300° C. for 3 hours; while this does not significantly affect the QY after treatment it was found to significantly improve the long term stability of the sample. It is important to note that there is a large variation in the QY of as-exfoliated monolayer samples (with peak QY ranging from 0.1% to 1%). All data taken on as-exfoliated monolayers in this manuscript are representative of samples with a peak QY close to 1%.

2. Calibrated Luminescence Efficiency Measurements

Figures 5A, 5B:
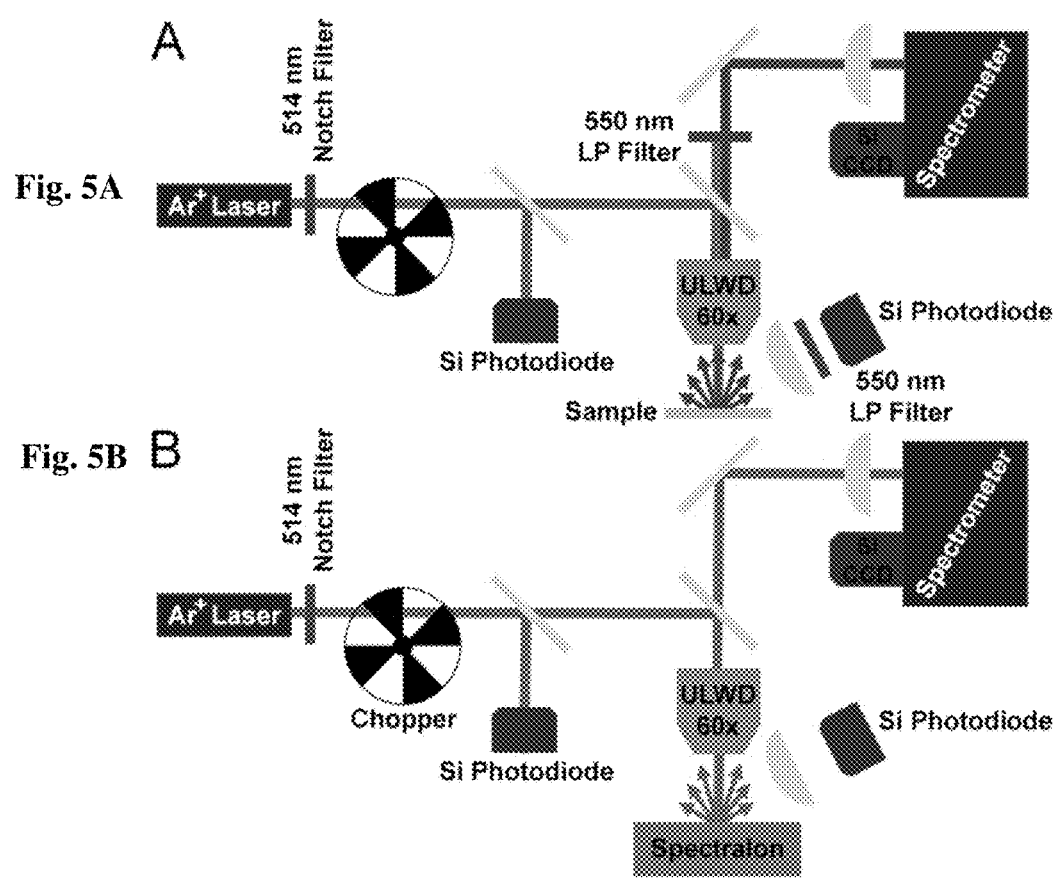
FIGS. 5A and 5B illustrate schematics of the optical setups used to measure external quantum efficiency.

The PL (photoluminescence) data presented here was obtained with a custom built micro-PL system using the 514.5 nm line of an Ar ion laser (Lexel 95) for excitation. The laser power was adjusted using various neutral density (ND) filters. An overview of the configuration used for measurement and the calibration of the instrument is shown in FIGS. 5A, 5B. The power of the excitation beam was measured during the duration of the measurement (130 times greater than the incident power on the sample) and was calibrated at high illumination intensity using a photodiode power meter (ThorLabs 120C). However, in order to accurately measure low (<100 pW) excitation power, lock-in detection from the output of a calibrated photodiode was used (noise equivalent power of $1.7 \times 10^{-13}$ WHz$^{-1/2}$). These values were carefully cross calibrated before all measurements at multiple laser powers to ensure the incident power was accurately measured. The laser beam was focused onto the sample using a 60× ultra-long working distance (ULWD) objective lens (NA=0.7) which resulted in a measured spot size of 3.8 µm$^2$. PL was collected by the same microscope objective, passed through a 550 nm dielectric longpass filter to remove the excitation signal, dispersed by an f=340 mm spectrometer with either a 150 g/mm or 600 g/mm grating, and detected by a Si CCD camera (Andor iDus BEX2-DD). The CCD background was obtaining by collecting a spectrum before each measurement at the same integration time without the laser on and was subsequently subtracted from the PL spectrum. We calculated the error in the integrated counts using:

$$\delta N = \frac{N}{\sqrt{N + n_{pix}\left(1 + \frac{n_{pix}}{n_b}\right)N_{RO}^2}}$$

where δN is signal to noise ratio, N is the total PL counts, $n_{pix}$ is the number of pixels, $n_b$ is the uncertainty from the background estimation, and $N_{RO}$ is the readout noise.

Prior to measuring, the entrance slit of the spectrometer was opened until the maximum number of PL counts was obtained. All measurements were performed using linearly polarized excitation, negating any effects from intervalley scattering by maintaining equivalent population in two valleys.

The spectrometer wavelength was calibrated using the atomic emission peaks from Ar and Kr lamps (Newport). The systems' relative sensitivity versus wavelength (instrument function) was evaluated by measuring the response of a virtual Lambertian black body light source created under the objective via illumination from a temperature stabilized lamp (ThorLabs SLS201) imaged onto a diffuse reflector (>1 cm thick spectralon) surface. The system efficiency was calibrated immediately after each measurement by removing the 550 nm long pass filter and measuring the response of the excitation laser focused on the diffuse reflector (>1 cm thick spectralon). This is a reasonable simulation of the PL source, as the emission profile of 2D materials has recently been experimentally measured and is approximately Lambertian. The pump-power dependence is converted to external quantum efficiency (EQE) by dividing by the absorbed pump power (P), i.e.: QY=PL/P.

Two independent approaches were used to verify the system calibration. First, to remove the possibility of errors due to the confocal nature of the spectral measurement, which is strongly dependent on the objective focus and the solid angle covered by the collection cone, we cross-calibrated using a calibrated silicon photodiode which was able to view a fraction of the luminescence but is independent of microscope optical path as depicted in FIGS. 5A, 5B; due to the relatively low sensitivity of the photodiode, these measurements were only performed at higher excitation power (>10 W/cm²). Calibrations were also performed using a sample with a known QY close to 100% (rhodamine 6G in methanol) using a procedure which has previously been used to measure the QY of 2D materials. These three methods were found to be in good agreement with each other (<15% error). For measurements taken against the spectralon reference the percent of generated photons which are able to escape from the sample was calculated using 1/4n², where n is the refractive index of the medium, this was used to determine the QY from the measured EQE (35).

The error in the QY measurements was calculated from the uncertainty in the laser power measurement, CCD signal, and the absorption coefficient. The overall error bounds for the measurement are given by:

$$\delta QY = QY\sqrt{\left(\frac{\delta P}{N}\right)^2 + \left(\frac{\delta N}{N}\right)^2 + \left(\frac{\delta \alpha}{N}\right)^2}$$

where, P and δP is the measured laser power and the corresponding uncertainty, N and δN is the measured CCD counts and corresponding uncertainty, and α and δα is the absorption coefficient at 514.5 nm and the corresponding uncertainty.

The normalized PL spectra used to generate the QY data shown in FIGS. 2A and 2B are depicted in FIG. 6. There is no observable change in the PL emission spectral shape as a function of pump power, indicating that we see no luminescence from biexcitonic recombination or through a secondary radiative mechanism.

3. Micro-Absorption and Reflection Measurements

Figures 7A, 7B:
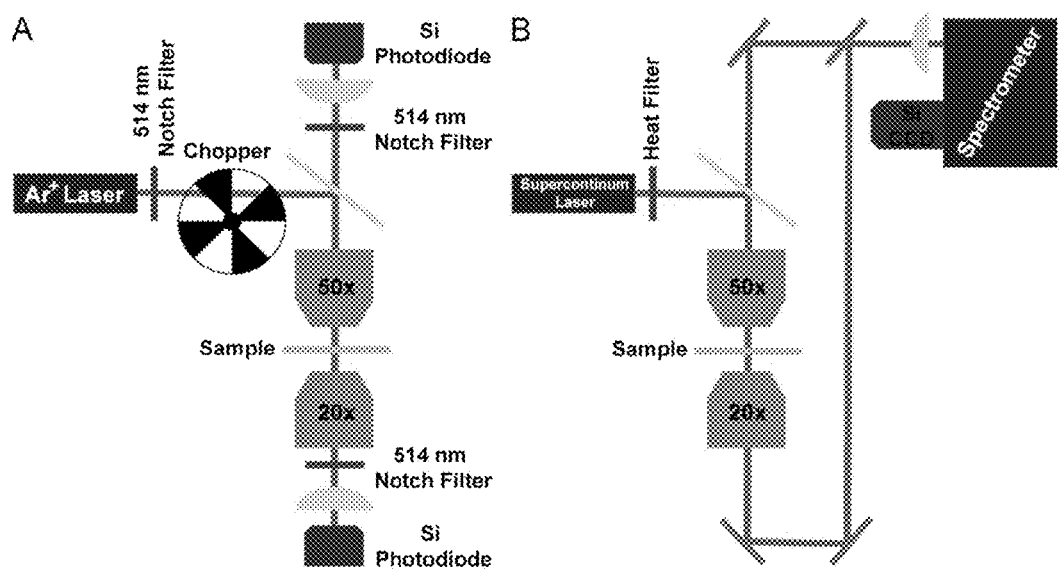
FIGS. 7A and 7B illustrate schematics of the optical setups used to measure absorption.
Figures 8A, 8B:
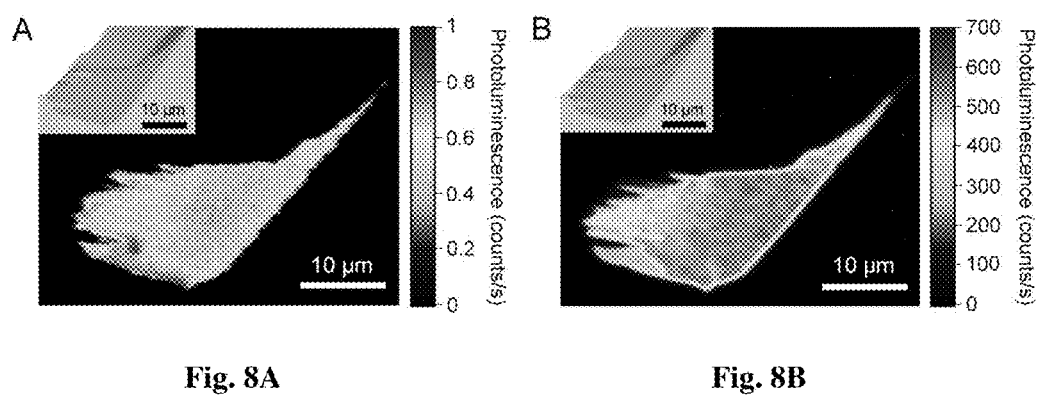
FIGS. 8A and 8B illustrate linear scale photoluminescence images.

Two sets of absorption/reflection measurements were performed for monolayer $MoS_2$ on quartz substrates both before and after treatment. First the absolute absorption at the PL excitation wavelength (514.5 nm) was measured using lock-in detection; a schematic of the setup is shown in FIG. 7A. The extracted absorption value of 7.53±0.23% is used for the QY calculations. Illumination from a supercontinuum laser source (Fianium WhiteLase SC-400) was used to obtain an absorption spectrum (total incident power <<1 W/cm²). Either the reflected or transmitted light was guided to a spectrometer to analyze the full spectrum. A schematic of the setup is shown in FIG. 7B. In both cases the light was focused on the sample using a 50× objective, the reflected light was collected via the same objective and the transmitted light was collected by a 20× objective. The system was calibrated using quartz and silver as reference transmission and reflectance standards. The reported generation rates (steady-state measurements) and initial carrier densities (time-resolved measurements) are calculated from the number of incident photons per unit area and the absorption.

4. Other Optical Methods

All measurements were taken starting from the lowest laser power and were stopped at a maximum power (10 μW) approximately one order of magnitude lower than what was found to cause sample degradation. The TFSI treated samples in particular were found to be sensitive to high illumination powers. An important consideration for $MoS_2$ is that the thickness of the sample (0.7 nm) is significantly less than the emission wavelength, thus the refractive index of the surrounding medium will determine the optical mode density and influence the measured lifetime according to the Füchtbauer-Ladenburg equation:

$$\frac{1}{\tau_r} = 8\pi n^2 c \int \frac{\sigma_{em}(\lambda)}{\lambda^4} d\lambda$$

which is an extension of the Einstein A and B coefficients where $\tau_r$ is the radiative lifetime, n is the refractive index of the medium, c is the speed of light in vacuum, $\sigma_{em}$ is the emission cross-section, and λ is the wavelength of spontaneous emission (36, 37). Therefore, we utilized quartz substrates for all measurements where an absolute QY and/or radiative lifetime is reported. It is important to note that in the case of samples with low luminescence (<10% QY) the measured lifetime will be dominated by the nonradiative lifetime ($\tau_{nr}$) and therefore approximately equal to $\tau_{nr}$, ergo this effect will not play a dominant role.

Raman spectra was measured with a triple spectrometer configured in subtractive mode with a 2400 g/mm grating in the final stage and using the 514.5 nm line of the Ar ion laser as the excitation source. PL imaging was performed using a florescence microscopy setup with a 470 nm LED excitation source (operating at 200 mA) and a CCD detector (Andor Luca). The background counts were subtracted from the PL images and cosmic rays were removed using a software filter; the images were then normalized by integration time. High resolution PL mapping was performed using a WITec Alpha 300RA equipped with a piezo electric scanning stage. The sample was excited using the 532 nm line of a frequency-doubled Nd:YAG laser as the excitation source and focused on the sample using a 100× objective.

For time-resolved photoluminescence performed on treated $MoS_2$, the sample was excited pulsed light at 5 MHz generated by a supercontinuum laser source (Fianium WhiteLase SC-400) (20-30 ps pulse width). A wavelength of 514 nm (2 nm measured bandwidth) was selected with a monochromer and was subsequently sent through a band-pass filter to remove any stray leakage light. The excitation was linearly polarized and focused on the sample with a 60× objective. The signal was detected with a low dark count avalanche photodiode operating in single photon counting mode (IDQuantiqe) and analyzed using a time correlated single photon counting module (TCSPC) (Becker-Hickl GmbH). The instrument response was 110 ps and the data was fit by deconvolution from the instrument response to a single exponential decay; the reported errors are the uncertainty from fitting.

Due to the extremely short lifetime of as-exfoliated $MoS_2$ monolayers, time-resolved measurements were also performed via a synchroscan streak camera (Hamamatsu) with an overall time resolution of 2 picoseconds as shown in FIG. S6. The sample was excited by 560 nm light generated by an optical parametric oscillator (Spectra Physics, Inspire HF 100) pumped by a mode-locked Ti:sapphire oscillator. The laser pulse width was 200 femtoseconds, and the repetition rate was 80 MHz. The linearly polarized excitation light was guided to an inverted microscope and focused on the sample by a 50× objective. The emission signal was detected in the back scattering configuration using emission filters to block the excitation laser prior to collection.

The band edge tail D(v) (also known as the Urbach tail) can be related to the photon emission rate per unit energy at steady-state conditions by the van Roosbroeck-Schockley equation:

$$D(v) \propto \frac{I(v)(e^{hv/kT}-1)}{n_r^2 v^2}$$

where, h is the Plank constant, k is the Boltzmann constant, T is temperature, and $n_r$ is the real part of the refractive index (22, 38). From this we can extract the Urbach parameter, $E_0$ (characteristic width of the absorption edge) using:

$$D(hv)=D_0 e^{(hv-E_g)/E_0}$$

where $E_g$ is the bandgap. The band edge tail for a sample before and after treatment is plotted in FIG. 12, and shows an improvement in the Urbach parameter from 17.4 meV to 13.3 meV, indicating reduced defects at the band edge and reduced lattice disorder. A spatial map of the Urbach parameter of a treated sample (insert of FIG. 12) shows that it is highly uniform.

5. Device Fabrication and Measurement

Back gated single layer thick $MoS_2$ transistors were fabricated on $Si/SiO_2$ substrates with a 50 nm thick oxide using standard e-beam lithography techniques. After patterning the flakes via dry etching by $XeF_2$, Ni/Au (10 nm/40 nm) contacts were deposited by e-beam evaporation. TFSI was found to attack Ni, even with an Au capping layer; as a result the treatment severely degrades the performance of the contacts and has a large negative impact on device performance. In order to mitigate this a 20 nm thick $ZrO_2$ barrier was grown by ALD directly over the contact regions to protect them during treatment, while leaving the $MoS_2$ channel exposed to the TFSI. Devices were measured in air using an Agilent 4155C parameter analyzer.

6. X-Ray Photoelectron Spectroscopy

X-ray photoelectron spectroscopy (XPS) was carried out using a monochromated Al Kα source (hv=1486.7 eV) and an Omicron EA125 hemispherical 7-channel analyzer. The XPS scans were acquired at a take-off angle of 45° with respect to the sample normal and pass energy of 15 eV. For XPS peak analysis and deconvolution, the software AAnalyzer was employed, where Voigt line shapes and an active Shirley background were used for peak fitting. The S/Mo ratios were determined from the integrated areas of the S 2p and Mo 3d peaks factored by their corresponding relative sensitivity factors. The error in the S/Mo ratios was obtained from the peak fitting residuals given by the AAnalyzer software.

Prior to superacid treatment, XPS scans were performed on crystals from the same bulk $MoS_2$ source (SPI Supplies) which was prepared by micromechanical exfoliation. Then, the $MoS_2$ sample was submerged in a superacid solution of 2 mg of TFSI in 10 ml of DCE for 10 minutes. The sample was removed and blow dried with nitrogen without rinsing and subsequently annealed at 100° C. for 5 min. The TFSI treated $MoS_2$ sample was loaded into UHV within five minutes for XPS analysis. To minimize contamination, the TFSI treatment was performed in Teflon labware which was cleaned by piranha solution followed by a DI water rinse. Monolayer samples prepared using this clean treatment procedure were found to also show a QY of >95%.

7. Calculation of Defect Band Structure and Defect Formation Energy

Theoretical calculations based on density functional theory (DFT) were performed with plane wave basis sets and Projector Augmented Wave (PAW) pseudopotentials as implemented in the Vienna ab initio simulation package (VASP) (43). A kinetic energy cutoff of 500 eV for the plane-wave basis set expansion is used. The exchange-correlation interactions are incorporated as a functional of Generalized Gradient Approximation (GGA) in the present work. A monolayer of 5×5 supercell of $MoS_2$ surface model constructed to investigate the $MoS_2$ surface. In the self-consistent field calculations, a F-centered 6×6×1 k-point mesh is employed for the supercell and a 12×12×1 k-point mesh is employed for density of states (DOSs) calculations. A monolayer of $MoS_2$ contains two atomic layers of sulfur and one atomic layer of molybdenum, which are periodically repeated. Each periodic layer is separated by ~16 Å of vacuum to avoid interaction between the two surfaces of the layer and their replica images. In this work, the atomic structures are relaxed until energy and Hellmann-Feynman force convergence criteria are less than $10^{-4}$ eV and 0.01 eV/Å, respectively, while the cell size was kept after the as-exfoliated surface was fully relaxed. The in-plane lattice constant (a) is calculated 3.16 Å in single-layer $MoS_2$. The formation energy of the defect is calculated by $$E_{form}^{defect} = E(\text{defect}) - E(MoS_2) - \sum_i N_i \mu_i$$

where E(defect) is the total energy of a single-layer $MoS_2$ containing a defect in the supercell, $E(MoS_2)$ is the total energy per a supercell of an as-exfoliated single-layer $MoS_2$ without a defect, $N_i$ is the number of i element added (or removed) in the supercell, $\mu_i$ is the chemical potential of the element i. In S-deficiency condition, $\mu_S=(\mu_{MoS2}-\mu_{Mo})/2$, where $\mu_{MoS2}$ is the total energy of the as-exfoliated monolayer $MoS_2$ per a formula unit and $\mu_{Mo}$ is the total energy of a Mo bcc metal per an atom. We obtained the chemical potential of oxygen and hydrogen from gas phase $O_2$ and $H_2$, respectively. Negative formation energy indicate that the surface is thermodynamically favorable to contain defects.

Supplementary Text

1. Recombination Model

In the recombination model typically used for III-V semiconductors, the total recombination is given by $R=An+Bnp+Cn^2p$, where A is the Shockley-Reed-Hall recombination, B is the radiative recombination, C is Auger recombination, and n and p are the 2D electron and hole concentrations respectively. The QY is then expressed as the ratio of the radiative rate over total recombination, yielding:

$$QY = \frac{Bnp}{An + Bnp + Cn^2p}$$

Figure 14:
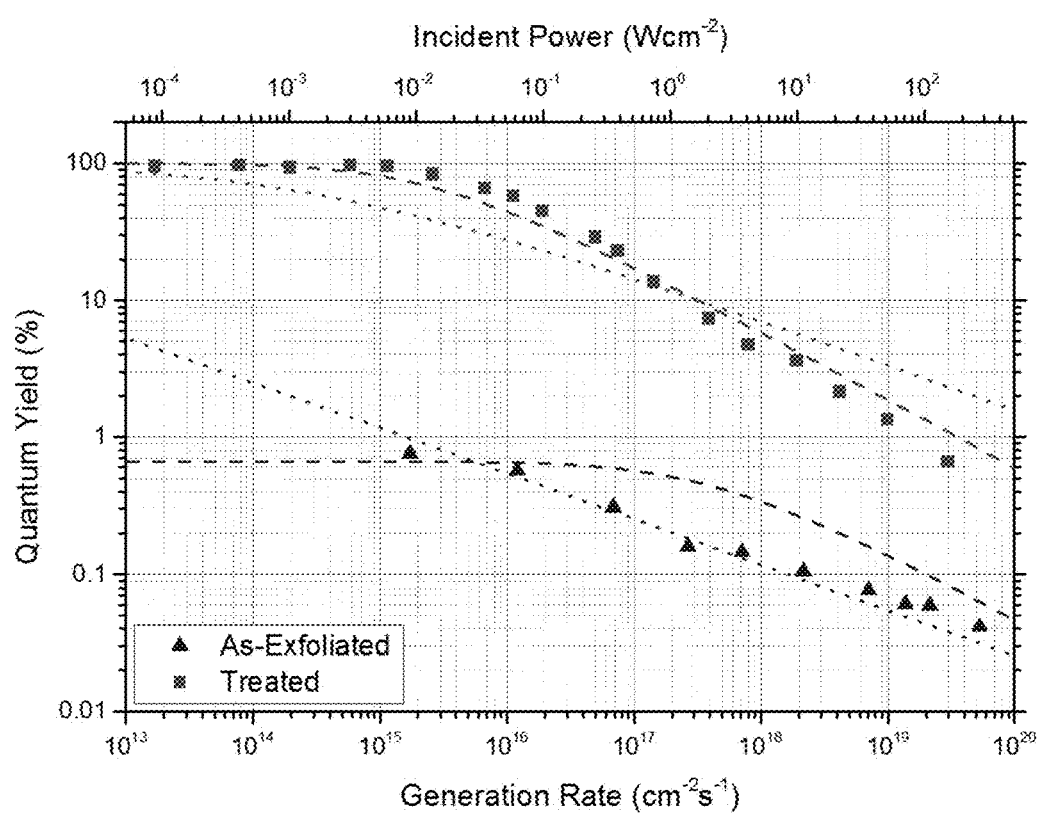
FIG. 14 illustrates a recombination Model. Pump-power dependence of the QY for as-exfoliated and treated $MoS_2$. Dotted curves show the standard semiconductor recombination model while the dashed curves show the modified recombination model for an excitonic system.

As a first pass, this model was used to describe the recombination kinetics observed in $MoS_2$ and is plotted as dotted curves in FIG. 14 (Treated: $A=0$ s$^{-1}$, $B=1\times10^{12}$ cm$^2$s$^{-1}$, $C=5\times10^{10}$ cm$^4$ s$^{-1}$; As-exfoliated: $A=0$ s$^{-1}$, $B=1.6\times10^{10}$ cm$^2$ s$^{-1}$, $C=5\times10^{10}$ cm$^4$ s$^{-1}$). While this model provides a good fit to the as-exfoliated data which indicates that there is an Auger like (three-particle) dependence on carrier density, it fails to accurately capture the behavior of the treated sample. Since $MoS_2$ is excitonic system, the standard semiconductor model (using 2D carrier densities) was modified to incorporate the formation of excitons from free carriers and a second generation-recombination balance equation was written for the exciton population. In its simplest form, neglecting any recombination mechanisms this is given by: $R=Bn^2$, $Bn^2=\tau_{rad}^{-1}\langle N \rangle$, where $\langle N \rangle$ is the exciton concentration. Several recombination mechanism were considered; however, we chose to implement only biexcitonic recombination (intrinsic material property) and defect-mediated non-radiative recombination of free carriers (extrinsic material property). The resulting balance equations have the form:

$$R = B_r n^2 + B_{nr} n^2$$

and $$B_r n^2 = \tau_r^{-1} \langle N \rangle + C_{bx} \langle N \rangle^2$$

where, $B_r$ is the formation rate of excitons, $B_{nr}$ is defect mediated non-radiative recombination of two free carries and a deep level trap, $\tau_r$ is the exciton radiative lifetime, and $C_{bx}$ is the biexcitonic recombination coefficient. The QY is then given as:

$$QY = \frac{\tau_r^{-1}\langle N \rangle}{\tau_r^{-1}\langle N \rangle + B_{nr} n^2 + C_{bx}\langle N \rangle^2}$$

The exciton formation is coupled to $\tau_r$, however, in the experiments discussed here, the two parameters cannot be distinguished. Thus, $B_r$ was arbitrarily set as $1\times10^4$ cm$^2$ s$^{-1}$ and $\tau_r$ was set to the longest measured lifetime (10 nanoseconds). The fitting results are plotted in FIG. 14. A biexcitonic recombination coefficient of 2.8 cm$^2$s$^{-1}$ was used in both the as-exfoliated and treated sample, and the defect mediated non-radiative recombination coefficient was increased from 0 cm$^2$ s$^{-1}$ in the case of treated $MoS_2$ to $1.5\times10^6$ cm$^2$s$^{-1}$ for as-exfoliated. The fitting is in reasonable agreement with the experimental data. Moreover it manages to effectively describe the data using previously reported recombination mechanisms.

2. Control Treatments

To better understand the role of surface chemical treatments on the QY of $MoS_2$, many treatments were performed in a variety of different molecules; the results are summarized in Table 1. Treatments in common hydroxide based species such as water and alcohol did not show PL enhancement. It is likely that the surface and defects in $MoS_2$ have already been exposed to air and moisture before treatments, and the defects on the surface are likely filled by adsorbed water or —OH groups. On the other hand, in cases of chlorine based treatments (DCE, DCB) a marginal PL enhancement was observed. This result indicates that there is a relatively strong interaction between chlorine-based molecules and the surface of $MoS_2$, which was reported previously for DCE. This motivated the selection of DCB/DCE (9/1 v/v %) as the solvent choice for treatment by TFSI, which was found to give the optimum treatment conditions, although other solvents were also effective.

To clarify the role of TFSI in passivating the surface of $MoS_2$, N-Phenyl-bis(trifluoromethanesulfonimide) (Ph-TFSI) was introduced as a control reagent. $MoS_2$ monolayers were treated with Ph-TFSI in a solution of DCB/DCE (9/1 v/v %) using the identical treatment procedure as TFSI (materials and methods). Figs. See 15A, 15B shows the pump-power dependence on PL and QY for Ph-TFSI treated and as-exfoliated monolayers. The Ph-TFSI solution does not significantly alter the QY relative to the original as-exfoliated sample. Considering that the only difference between TFSI and Ph-TFSI is the replacement of hydrogen with a phenyl group, hydrogen is believed to play a critical role in the passivation of defect sites leading to the enhancement of QY.

Figure 16B:
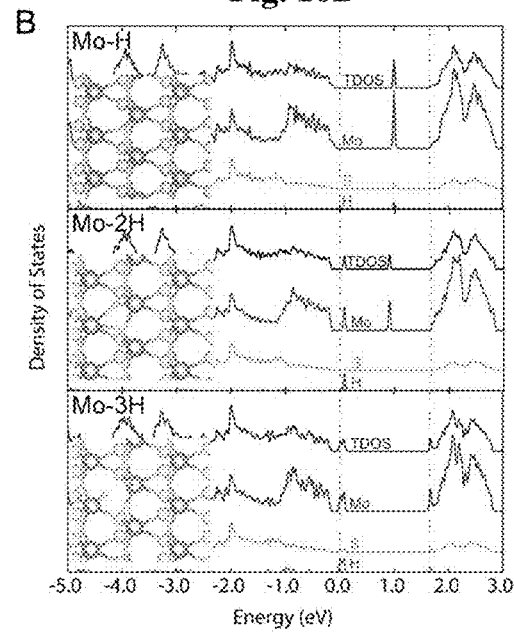

A wide variety of possible defect sites have been observed in $MoS_2$, both through scanning tunneling microscopy (STM) or through transmission electron microscopy (TEM). The DoS for the most commonly observed defect, sulfur vacancies ($V_s$) as well as a vacancy site with an adsorbed —OH group are shown in FIG. 16A. Both of these scenarios induce midgap trap states which can induce defect-mediated Auger recombination and quench the PL. To determine the possible mechanism of the treatment we examined several plausible scenarios. Firstly, due to the high stability of its ionic state, which arises from the delocalization of the anion charge on the nitrogen it is highly unlikely that the TFSI anion passivates the surface. Passivation of dangling bonds at the vacancy site by hydrogen was also considered, and DoS calculations show that the midgap states are removed when the three dangling bonds which occur at the sulfur vacancy site are passivated by hydrogen as shown in FIG. 16B. This scenario was also found to be improbable however, since it is highly energetically unfavorable (FIG. 16C); additionally, hydrogenation of Mo in $MoS_2$ has been found to be unlikely in previous reports.

What is claimed is:

1. A method of passivating and repairing a two-dimensional (2D) transition metal dichalcogenide (TMDC) to enhance a photoluminescence quantum yield (QY) comprising:
dissolving bis(trifluoromethane)sulfonimide (TFSI) in 1,2-dichloroethane (DCE) to make a solution;
diluting the solution with 1,2-dichlorobenzene (DCB) or DCE to make a TFSI solution; immersing a TMDC sample in the TFSI solution; and
annealing the TMDC sample at an elevated temperature.

2. The method of claim 1, wherein the 2D transition metal dichalcogenide is selected from the group consisting of $MoS_2$, $WS_2$, $MoSe_2$, $Wse_2$, $MoTe_2$, and $WTe_2$.

3. The method of claim 1, further comprising dissolving 20 mg of TFSI in 10 ml of DCE to make a 2 mg/ml solution, further diluting the solution with DCB or DCE to make a 0.2 mg/ml TFSI solution, immersing the TMDC sample in the 0.2 mg/ml TFSI solution in a closed vial for between 1 min and 20 min , at an elevated temperature between 90° C. to 110° C., removing the TMDC sample and blow drying with nitrogen without rinsing and subsequently annealing the TMDC sample at an elevated temperature between 90° C. to 110° C. for between 1 min and 10 min.

* * * * *